United States Patent

Clayfield et al.

[11] Patent Number: 5,727,461
[45] Date of Patent: Mar. 17, 1998

[54] METHOD OF FORMING FIDUCIALS, AND STENCILS CONTAINING SUCH FIDUCIALS

[75] Inventors: Jamie S. Clayfield, Rochester; Philip J. Entingh, Ontario, both of N.Y.

[73] Assignee: AMTX, Inc., Canandaigua, N.Y.

[21] Appl. No.: 795,765

[22] Filed: Feb. 6, 1997

[51] Int. Cl.$^6$ .................................................. B05C 17/06
[52] U.S. Cl. ........................................ 101/127; 101/128.4
[58] Field of Search ............................. 33/666; 101/127, 101/128.4

[56] References Cited

U.S. PATENT DOCUMENTS

| | | | |
|---|---|---|---|
| 4,283,844 | 8/1981 | Milden et al. | 29/623.5 |
| 5,086,478 | 2/1992 | Kelly-Mahaffey et al. | 382/8 |
| 5,129,155 | 7/1992 | Hoffman et al. | 101/115 |
| 5,148,600 | 9/1992 | Chen et al. | 33/1 M |
| 5,478,699 | 12/1995 | Blessington et al. | 430/308 |
| 5,539,153 | 7/1996 | Schwiebert et al. | 174/260 |
| 5,595,193 | 1/1997 | Walus et al. | 128/898 |

FOREIGN PATENT DOCUMENTS

A-61-84649  4/1986  Japan.
A-63-9127   1/1988  Japan.

Primary Examiner—Edgar S. Burr
Assistant Examiner—Daniel J. Colilla
Attorney, Agent, or Firm—Oliff & Berridge, P.L.C.

[57] ABSTRACT

A method of forming a fiducial in a stencil for screen printing and the stencil so formed is described. A target fiducial thru-hole of a first size is formed in the stencil, the surface of the stencil in an area around and larger than the size of the target thru-hole is electrochemically etched, and the target fiducial thru-hole is filled with a filling material. The target fiducial thru-hole, included as part of the stencil pattern, is used as a target to which the fiducial mask, used in the electrochemical etching, can be aligned to. The target fiducial thru-hole may be made smaller than previously feasible because the fiducial is electrochemically etched, which means that it cannot fall out of the stencil. The filling in the target fiducial thru-hole is less likely to fail since it has a drastically decreased surface area to wall thickness area ratio compared to conventionally formed fiducials.

16 Claims, 2 Drawing Sheets

METHOD OF FORMING FIDUCIALS, AND STENCILS CONTAINING SUCH FIDUCIALS

BACKGROUND OF THE INVENTION

1. Field of the Invention

This invention relates to a method of forming fiducials in a stencil for use in screen printing in the electronics industry. This invention further relates to the stencil containing such fiducials.

2. Discussion of Related Art

The use of stencils in screen printing applications is well known. See, for example, U.S. Pat. No. 5,478,699 to Blessington et al. Screen printing stencils have a wide variety of uses in the electronic substrate fabrication and electronic assembly industries. These include, but are not limited to, the printing of conductors, resistors, dielectrics, solder masks, and solder pastes.

In these uses of stencils for screen printing, it is often necessary to have very precise alignment of the stencil upon the substrate to be printed so that the pattern printed upon the substrate is precisely placed within very tight tolerances. This is particularly true, for example, when screen printing solder pastes onto device pads of a printed circuit board.

One well known system used in the precision alignment of stencils upon substrates to be screen printed involves the use of fiducials in the stencil. Conventional fiducials are thru-holes or openings in the stencil that are filled with black tinted epoxy. In such an alignment method, the location of the fiducials in relation to the pattern of the stencil is exactly known. A vision system that is typically computer controlled aligns the fiducials of the stencil with corresponding fiducials on the substrate to be printed by precisely locating the fiducial utilizing the color contrast between the stencil and fiducial, thereby insuring precise alignment within the desired tolerances. See, for example, U.S. Pat. No. 5,539,153 to Schwiebert et al. and U.S. Pat. No. 5,086,478 to Kelly-Mahaffey et al.

The black tinted epoxy filling of the conventional fiducial serves two main purposes. First, the epoxy filling provides the color contrast necessary for the vision system to detect the fiducial. Second, the filling prevents any of the printing material, for example a solder paste, from passing through the fiducial and onto the substrate.

Despite the precision alignment enabled by the use of fiducials, a problem exists in the art regarding the use of fiducials. Conventional fiducials are comprised solely of thru-holes, and the filling thus must fill the entire fiducial. Conventional fiducials typically have thru-holes with sizes of from 0.01 inches to 0.12 inches, with the most typical sizes being from 0.04 inches to 0.05 inches in diameter. However, fiducials of such size have a high tendency to fail, i.e., have the fiducial filling fall out of the fiducial after only short periods of stencil use (i.e., printing and cleaning). Failure of the epoxy filling results in product defects and costly down time in order to repair the stencil, both of which unsatisfactorily increase production costs.

It is believed that the epoxy filling has a tendency to fall out of fiducials having such larger sizes because of the small sidewall surface area of the fiducial to which the filling can bond. Moreover, stencil thicknesses are continuing to decrease, thereby providing an even smaller sidewall surface area to which the filling can bond and increasing the failure rate of the epoxy filling in the fiducials even further.

SUMMARY OF THE INVENTION

It is therefore an objective of the invention to address the problem of the fiducial filling material falling out of the stencil, a common problem in the stencil user industry. More specifically, it is an objective of this invention to provide an effective means for forming permanent fiducials in stencils within the required positional accuracy of ±0.0005 inches. It is a still further objective of the invention to develop a simple, low cost method of producing such fiducials in stencils.

These and other objectives are achieved in the present invention by forming the fiducial by electrochemically etching an area of a surface of the stencil surrounding a target fiducial thru-hole, the etched area having a size greater than the size of the target fiducial thru-hole. The etching provides the fiducial as a dark marking upon the surface of the stencil, thereby providing a contrast area larger than that provided by the filled target fiducial thru-hole. The larger contrast area permits easy detection of the fiducial by a vision alignment system, regardless of the size of the target fiducial thru-hole.

The etching also permits the size (i.e., diameter or width) of the target fiducial thru-hole to be reduced compared to thru-holes of conventional fiducials, without adversely reducing the contrast area. Once the target fiducial thru-hole is filled, for example with a polymer such as a darkly tinted epoxy, the filling exhibits little or no tendency to fall out of the target fiducial thru-hole during use because the smaller size of the target fiducial thru-hole significantly reduces the fiducial surface area to wall thickness area ratio.

DETAILED DESCRIPTION OF PREFERRED EMBODIMENTS

Figure 1:
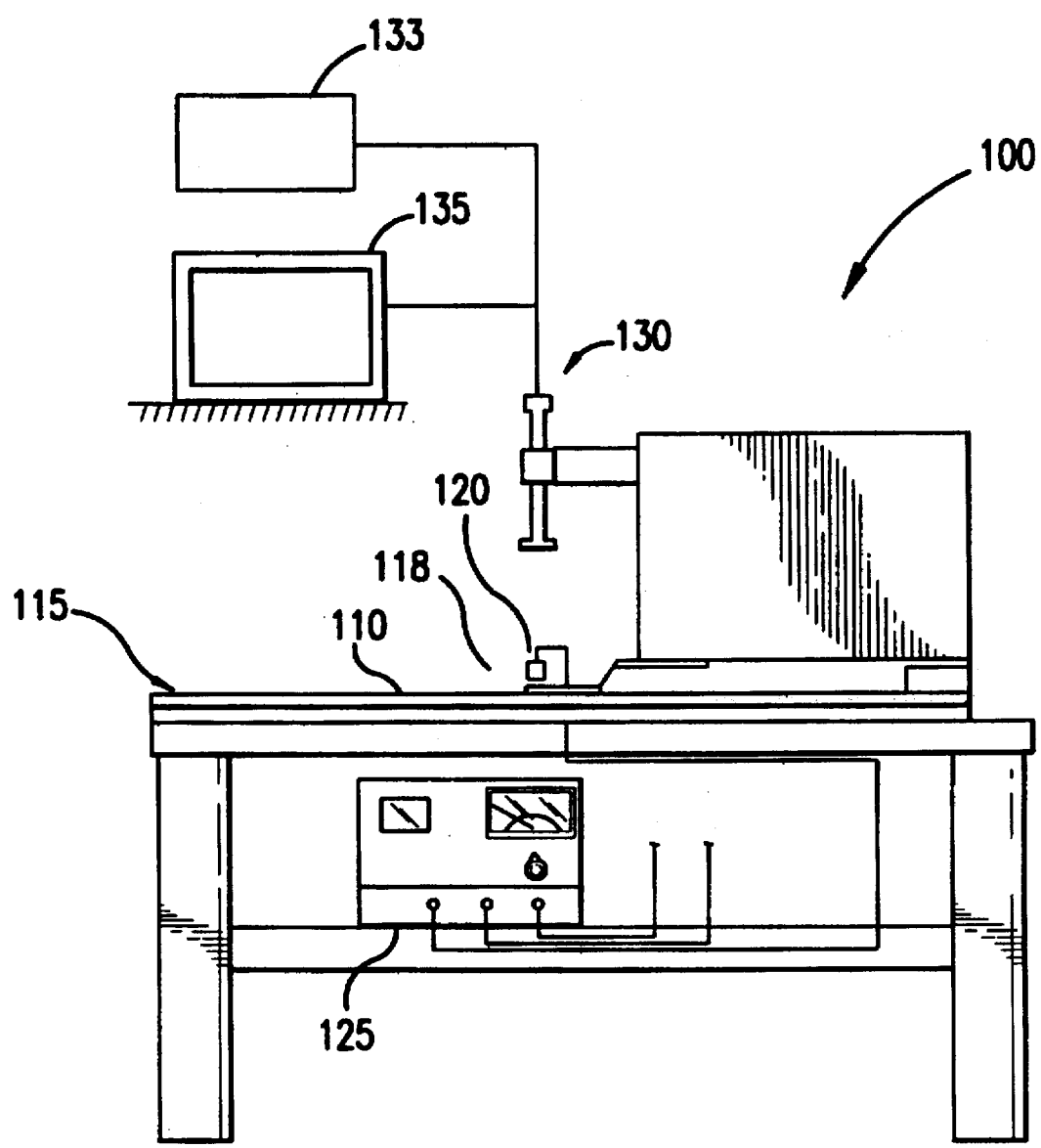
FIG. 1 illustrates an apparatus that may be used to etch the surface of a stencil.

Stencils may be made of, for example, metals, although any suitable material may be used in the present invention. Examples of metals which can be used include, but are not limited to, nickel, stainless steel, copper, gold, silver, palladium, tin, lead, chromium, zinc, cobalt, iron, and alloys thereof. The most preferred metals are nickel and stainless steel.

Stencils for screen printing applications, for example for use in the electronic substrate fabrication and electronic assembly industries including but not limited to the printing of conductors, resistors, dielectrics, solder masks and solder pastes, have a pattern therein corresponding to the pattern to be printed. Methods of forming patterned stencils are well known in the art.

As an example, a stencil to be used in printing solder paste onto device pads of a printed circuit board would have a pattern corresponding to the device pads. Once the stencil is properly aligned upon the printed circuit board, a solder paste is typically screen printed through the stencil apertures using a squeegee blade. The solder paste is deposited onto the device pads. The thickness of the solder paste corresponds to the thickness of the stencil. The stencil is then removed from the printed circuit board, or any other substrate that is being printed, leaving the solder paste on the device pads. The stencil is then cleaned of solder paste for subsequent use.

To ensure precise alignment of the stencil upon the substrate to be printed, fiducials are provided in the stencil that provide a sufficient contrast between the stencil surface and the fiducial to enable detection by the vision system. The vision system is typically computer controlled and aligns the stencil with the desired location on the substrate to be printed, using the fiducials as locating guides.

Patterned stencils can be prepared in any manner known in the art. Suitable examples include, but are not limited to, chemical etching, mechanical etching, plasma etching, laser ablating and electroforming. All of these methods of forming patterned stencils are well known in the art.

Fiducials in stencils of the present invention are formed by electrochemically etching a dark marking onto the stencil surface, unlike conventional fiducials which are formed simply as thru-holes filled with a dark tinted epoxy. The fiducial (i.e., the etched area) is precisely positioned on the stencil with the assistance of a target fiducial thru-hole. Precise positioning of the etched area is necessary in order to permit the stencil to be subsequently aligned upon the substrate to be printed within the positional accuracy requirements. Thus, the fiducial forming method uses target fiducial thru-holes for precision alignment purposes to enable the actual fiducial to be electrochemically etched onto the stencil within the necessary positional accuracy.

The target fiducial thru-holes may be formed in the stencil in any suitable manner known in the art. Preferably, the target fiducial thru-holes are formed in the stencil in the same process in which the pattern is formed in the stencil. In this manner, the position of the target fiducial thru-holes in relation to the stencil pattern is precisely known. Thus, if the stencil pattern is formed by laser ablation, the target fiducial thru-holes are also formed by laser ablation at the same time the pattern is formed. The target fiducial thru-holes may be formed by any known method in the art, including but not limited to chemical etching, mechanical etching, plasma etching, laser ablating and electroforming.

A particularly preferred method for forming the target fiducial thru-holes in a stencil, as well as the stencil pattern, is electroforming. A suitable electroforming method is disclosed, for example, in U.S. Pat. No. 5,478,699 to Blessington et al., which is incorporated herein by reference. In such a method, the stencil material is electroformed, i.e., grown via deposition, upon a mandrel containing a resist pattern complementary to the stencil pattern and fiducials to be formed in the stencil. The mandrel is thereafter removed to obtain the stencil containing fiducial thru-holes and the stencil pattern.

The target fiducial thru-holes can have any suitable shape. Thus, when the term "size" is used herein, it means the width or diameter of the target thru-hole depending on the configuration of the thru-hole. For ease in manufacturing, a preferred configuration for thru-holes is a circle. Whereas conventional fiducials have circular thru-holes of a uniform size ranging from about 0.01 inches to about 0.12 inches, with sizes typically on the order of 0.04 or 0.05 inches in diameter, the present invention allows the size of the target fiducial thru-hole to be reduced to a smaller diameter, on the order of, for example, 0.005 to 0.014 inches, since the majority of the fiducial area is being electrochemically etched onto the stencil as opposed to being filled with a tinted material.

The etching of the surface of the stencil around the target fiducial thru-hole provides a darkened contrast area of a sufficient size to be detectable by the vision system used to align the stencil on a substrate to be screen printed, which contrast area would otherwise be reduced beyond the point of recognition by the vision system if conventional fiducial thru-holes were simply reduced in size without the surface etching. By "contrast area" is meant an area of sufficient color contrast or darkness that provides a detectable contrast between the contrast area and surrounding areas of the stencil surface.

The size of the etched fiducial of this invention may be of the same size as conventional thru-hole fiducials, but the target thru-holes of the present invention have the advantage of being smaller in size. An advantage to providing target fiducial thru-holes of smaller sizes is that the likelihood of the fiducial filling falling out of the thru-hole during normal screen printing and cleaning operations is drastically reduced. Thus, fiducial filling failures are substantially eliminated, as are the large cost inefficiencies associated with fiducial filling failures, by the use of smaller fiducial thru-hole sizes.

It is believed that the substantial elimination of fiducial filling failures is a result of the fiducial surface area to wall thickness area ratio being reduced. This invention permits the fiducial to be electrochemically etched onto the stencil, as opposed to being formed as a large thru-hole filled with epoxy, thereby drastically reducing the filled fiducial surface area to wall thickness area ratio. Reducing this ratio implies that there is less available area that can be acted upon by the forces of screen printing and cleaning, which means that the filling in the target thru-hole is much less prone to falling out. Reduction of the filled fiducial surface area to wall thickness area ratio thus results in an increased ability of the filling material to remain firmly bonded to the target thru-hole wall. Thus, the invention provides a simple, low-cost method to dramatically stabilize the bond without compromising the size of the resultant fiducial used for alignment in the screen printing process.

Following formation of the target thru-holes, the surface of the stencil surrounding the target thru-holes is etched in order to form the fiducial as a darkened region, i.e., to provide a contrast area on the surface of the stencil. Precision, concentric positioning of the etched area on the surface of the stencil using a target fiducial thru-hole is discussed below with reference to the drawing figures. The size of the etched area must be larger than the size of the target thru-holes- Here again, "size" of the etched area means width or diameter, depending on the shape of the etched area- The size of the etched area has a size of from, for example, 0.04 to 0.12 inches, preferably from 0.04 to 0.08 inches. The etched area may have any shape, with a circular shape being most preferred.

The etching is electrochemical etching, which is a well known method in the art. In such method, an electrolyte material is supplied to the area to be etched while an electrical current is applied. To achieve a blackened electrochemically etched mark, the electrical current on the power unit of the etching equipment should be set to alternating current (AC). An electrolyte material capable of etching the stencil material is selected. For example, in a preferred embodiment where the stencil is nickel, the electrolyte may be, for example, MSC7 or F30, both manufactured by Marking Methods, Inc. of Alhambra, Calif. Marking Methods, Inc. markets electrolyte materials for etching many metal materials. In addition, other typical etchants include, for example, hydrofluoric acid and ethylenediamine pyrochatecol.

Etching for a time of, for example, 1 to 10 seconds, more preferably 5 to 10 seconds, is typically sufficient. The period of etching may be adjusted, and any period is sufficient so long as the etching results in a permanent marking in the etched area of sufficient darkness/color contrast from the non-etched areas of the stencil surface to permit detection by the vision system. In a preferred embodiment where the filling material is a black tinted epoxy, the electrochemically etched area is a permanent black marking comparable to that of the black tinted epoxy.

FIG. 1 illustrates an example of a device 100 that may be used in accomplishing etching of the surface of the stencil. In the device, the stencil 110 to be electrochemically etched is placed upon a surface 115 of the device. Surface 115 preferably is a flat, smooth rigid surface supported upon a rigid table. The stencil is positioned so that the target fiducial thru-hole is centered within the camera's field of view as seen on the monitor 135. The current is supplied from electrochemical marking device 125. The electrolyte may be supplied by any suitable means, including direct application of the electrolyte to marking pad 120. The etching area and pattern is controlled by mask 118, for example a Mylar® mask a polyester material that is a trademark of E. I. du Pont de Nemours.

Precision positioning of the mask upon the stencil is achieved in conjunction with vision system 130. The vision system includes a circle generator 133 and a monitor 135 to view positioning of the stencil and insure precision alignment.

Figure 2A:
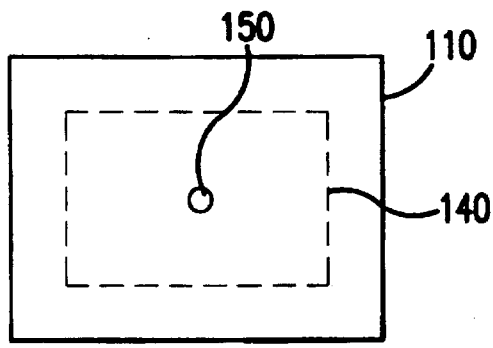
FIGS. 2A–2E illustrate an example method of etching the surface of a stencil.
Figure 2B:
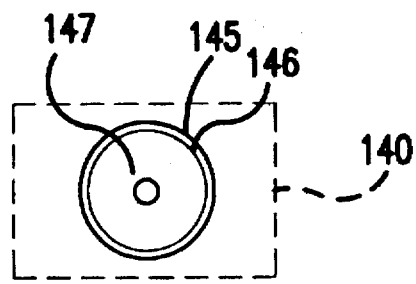
Figure 2C:
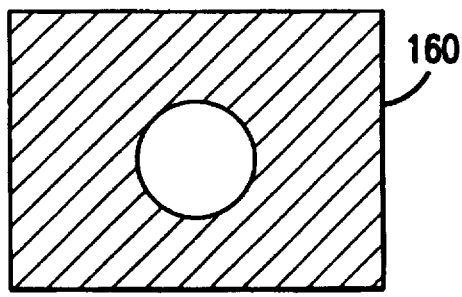

FIGS. 2A–2E illustrate a method of etching the surface of the stencil 110 around the target fiducial thru-hole 150. In FIGS. 2A–2D, use of the vision system 130 to align the mask upon the stencil is illustrated. FIG. 2A is a view of stencil 110 having a target thru-hole 150. The target thru-hole may have a size of, for example, 0.01 inches in diameter. Border 140 is the viewing area of the vision system monitor. FIG. 2B is a view of electronically generated circles 145, 146 and 147 as seen on the vision system monitor. The circles are used in concentrically aligning the mask to the target fiducial thru-hole. Mask 160 having an opening, here a circle, corresponding to the size of the area to be etched, is illustrated in FIG. 2C. The size of the opening in the mask may be, for example, 0.04 inches in diameter. The mask typically has a thickness on the order of 0.002 inches.

Figure 2D:
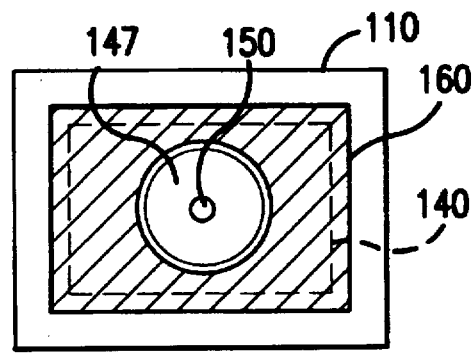

FIG. 2D illustrates a view of the mask 160 superimposed on top of stencil 110. The smallest circle 147 is concentrically aligned to the target fiducial thru-hole. The opening in the mask is positioned until it fits within the larger circles 145 and 146. The larger circles may be, for example, 0.001 inches apart. In this manner, the mask can be located to a very precise tolerance, for example within ±0.0005 inches.

Once the mask is aligned to the two larger electronically generated circles, the surface of the stencil is etched.

Stencils for screen printing have a thickness on the order of, for example, 0.001 to 0.012 inches, preferably 0.004 to 0.008 inches. Stencils have in recent years become thinner, thus reducing the bonding surface area within the fiducial and increasing the occurrence of the fiducial filling falling out. However, the present invention addresses this problem by allowing the fiducial to be electrochemically etched around the target fiducial thru-hole, turning the stencil surface within the opening of the mask darker in color, and thus permitting fiducials to be available for thinner stencils.

Following etching, the mask is removed and the stencil and fiducial are cleaned. Cleaning is achieved in a manner well known in the art. Any cleaning method and/or cleaning material may be used without limitation.

Figure 2E:
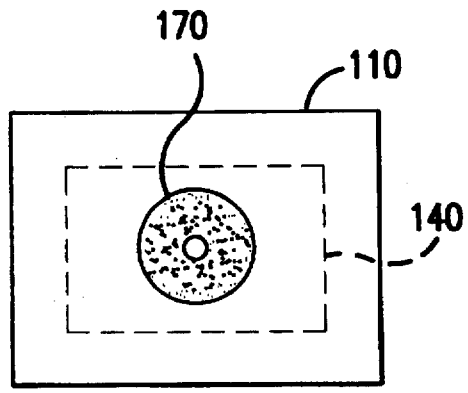

FIG. 2E is a top view of the stencil 110 following etching and cleaning. Etched area 170 is larger than target fiducial thru-hole 150, thus increasing the contrast area on the surface of the stencil.

The final step in preparing the fiducial is to fill the target fiducial thru-hole with a material that will both provide a contrast comparable to that of the etched area and be able to withstand without degradation the screen printing process and subsequent cleaning materials and processes. Any material possessing such properties may suitably be used. Dark color tinted, preferably black tinted, polymer/plastic materials are a preferred example. In a most preferred embodiment, the fiducial thru-hole filling material is a high-strength black tinted epoxy. Such an epoxy is well known in the art.

In the example illustrated in FIG. 2, the target fiducial thru-hole has a diameter of, for example, 0.01 inches and the etched area has a size of, for example, 0.04 inches. In such a fiducial, only the target fiducial thru-hole of 0.01 inches in diameter is filled with a filling material. In a conventional fiducial having a size of 0.04 inches in diameter, the entire 0.04 inches in diameter thru-hole needs to be filled with the filling material. The conventional fiducial is thus much more likely to have the filling fall out compared to the fiducial of the present invention.

The filling material in the fiducials prepared by the invention exhibit little, and preferably no, tendency to fall out of the fiducial during use of the stencil (i.e., screen printing and cleaning). The present invention achieves this result in a simple, low-cost manner, and does not require any altering of the nature of the filling material or the fiducial wall surface, nor the introduction of any additional costly bonding aids. The invention decreases the fiducial surface area to thickness area ratio, thus drastically reducing the occurrence of the filling material falling out of the fiducial.

The invention has been described in detail with particular reference to preferred embodiments thereof. However, it will be appreciated that those skilled in the art, upon consideration of this disclosure, may make variations and modifications within the spirit and scope of the invention.

What is claimed is:

1. A method of forming a fiducial in a stencil, comprising: forming a fiducial by electrochemically etching the fiducial concentrically about a target fiducial thru-hole, and filling the target fiducial thru-hole with a filling material.

2. The method according to claim 1, wherein the electrochemically etched fiducial is formed concentrically about the target fiducial thru-hole within a positional accuracy of ±0.0005 inches.

3. The method according to claim 1, wherein the target fiducial thru-hole is formed by a method selected from the group consisting of chemical etching, plasma etching, mechanical etching and laser ablating.

4. The method according to claim 1, wherein the target fiducial thru-hole is formed by electroforming.

5. The method according to claim 1, wherein the target fiducial thru-hole has a diameter of from 0.005 to 0.014 inches.

6. The method according to claim 1, wherein the electrochemically etched fiducial has a diameter of from 0.04 to 0.12 inches.

7. The method according to claim 1, wherein the method further comprises prior to the step of electrochemically etching, aligning a mask having an opening corresponding to a size and shape to be electrochemically etched about the target fiducial thru-hole, and subsequent to the step of electrochemically etching, removing the mask and cleaning the electrochemically etched surface.

8. The method according to claim 1, wherein the electrochemically etching forms a permanent black marking on the surface of the stencil in the area etched.

9. The method according to claim 1, wherein the stencil has a thickness of from 0.001 to 0.012 inches.

10. The method according to claim 1, wherein the filling material is a black tinted epoxy.

11. A stencil for use in screen printing, the stencil comprising a pattern to be screen printed, at least one fiducial comprising a target fiducial thru-hole, filled with a filling material, of a first size and an etched area of a second size larger than the first size and concentric about the target fiducial thru-hole on a surface of the stencil.

12. The stencil according to claim 11, wherein the first size of the target fiducial thru-hole is a diameter of from 0.005 to 0.014 inches.

13. The stencil according to claim 11, wherein the second size of the etched area is a diameter of from 0.04 to 0.12 inches.

14. The stencil according to claim 11, wherein the stencil has a thickness of from 0.001 to 0.012 inches.

15. The stencil according to claim 11, wherein the filling material is a black tinted epoxy.

16. The stencil according to claim 15, wherein the etched area is a black marking with a contrast comparable to that of the black tinted epoxy.

* * * * *